(12) United States Patent
Wu et al.

(10) Patent No.: US 11,003,302 B1
(45) Date of Patent: May 11, 2021

(54) ARRAY SUBSTRATE AND DISPLAY PANEL

(71) Applicant: Xiamen TianMa Micro-Electronics CO., LTD., Xiamen (CN)

(72) Inventors: Xiaoxiao Wu, Xiamen (CN); Xiai Xu, Xiamen (CN); Guozhao Chen, Xiamen (CN)

(73) Assignee: Xiamen TianMa Micro-Electronics CO., LTD., Xiamen (CN)

( * ) Notice: Subject to any disclaimer, the term of this patent is extended or adjusted under 35 U.S.C. 154(b) by 0 days.

(21) Appl. No.: 16/825,838

(22) Filed: Mar. 20, 2020

(30) Foreign Application Priority Data

Nov. 26, 2019 (CN) .......................... 201911173588.X

(51) Int. Cl.
| | | |
|---|---|---|
| *G06F 3/043* | (2006.01) | |
| *G06F 3/047* | (2006.01) | |
| *H01L 27/12* | (2006.01) | |
| *G06K 9/00* | (2006.01) | |
| *G06F 3/041* | (2006.01) | |
| *H04M 1/02* | (2006.01) | |
| *H01L 41/04* | (2006.01) | |

(52) U.S. Cl.
CPC ............ *G06F 3/047* (2013.01); *G06F 3/0412* (2013.01); *G06K 9/0002* (2013.01); *G06K 9/00973* (2013.01); *H01L 27/124* (2013.01); *H01L 41/042* (2013.01); *H04M 1/0266* (2013.01); *H04M 2201/38* (2013.01)

(58) Field of Classification Search
CPC ..... G06F 3/047; G06F 3/0412; G06K 9/0002; G06K 9/00973; H01L 27/124; H01L 41/042; H04M 1/0266; H04M 2201/38
See application file for complete search history.

(56) References Cited

U.S. PATENT DOCUMENTS

2021/0019018 A1\* 1/2021 Guo .................. H01L 41/042

FOREIGN PATENT DOCUMENTS

| CN | 107870691 A | 4/2018 |
| CN | 108647669 A | 10/2018 |

\* cited by examiner

*Primary Examiner* — Abdul-Samad A Adediran
(74) *Attorney, Agent, or Firm* — Christensen O'Connor Johnson Kindness PLLC

(57) ABSTRACT

An array substrate and a display panel including the array substrate are provided. The array substrate has a display area and a fan-shaped wiring area. A first metal layer, a second metal layer, and a third metal layer are arranged in both the display area and the fan-shaped wiring area, and a fourth metal layer is arranged in the fan-shaped wiring area. In the display area, the first metal layer includes gate lines, the second metal layer includes data lines, and the third metal layer includes touch lines. Fingerprint identification signal lines are arranged in the fan-shaped wiring area and are electrically connected to fingerprint identification units arranged in the display area. The fourth metal layer arranged in the fan-shaped wiring area includes at least one of the fingerprint identification signal lines, which avoids too many fingerprint identification signal lines being arranged in the same layer with other signal lines.

20 Claims, 9 Drawing Sheets

US 11,003,302 B1

ARRAY SUBSTRATE AND DISPLAY PANEL

CROSS-REFERENCE TO RELATED DISCLOSURES

The present application claims priority to Chinese Patent Application No. 201911173588.X, filed on Nov. 26, 2019, the content of which is incorporated herein by reference in its entirety.

TECHNICAL FIELD

The present disclosure relates to the field of display, and in particular, to an array substrate and a display panel.

BACKGROUND

The display panel is widely used as an information input tool in various display products such as mobile phones, tablet computers, and information inquiry machines. The fingerprint identification is widely used in display panels as a way of user identity authentication and access. In order to improve the user experience, fingerprint identification units are usually integrated in the display panel, and as users demand for fingerprint identification increases, the accuracy of fingerprint identification has become a research hotspot.

With the integration of fingerprint identification units in the display panel and the increased demand for accuracy of the fingerprint identification, the number of signal lines related to the fingerprint identification is increasing. For example, in a fan-shaped wiring area it has become difficult to carry more fingerprint identification-related signal lines with a narrow border, especially so in the case of a small height of the fan-shaped wiring area.

SUMMARY

In a first aspect, the present disclosure provides an array substrate having a display area and a fan-shaped wiring area. The array substrate comprises a first metal layer, a second metal layer, and a third metal layer which are arranged in the display area and the fan-shaped wiring area, and a fourth metal layer arranged in the fan-shaped wiring area. The first metal layer arranged in the display area comprises a plurality of gate lines, the second metal layer arranged in the display area comprises a plurality of data lines, and the third metal layer arranged in the display area comprises a plurality of touch lines. A plurality of fingerprint identification units is arranged in the display area, and a plurality of data signal lines, a plurality of touch signal lines and a plurality of fingerprint identification signal lines are arranged in the fan-shaped wiring area. The plurality of data signal lines is electrically connected to the plurality of data lines, the plurality of touch signal lines is electrically connected to the plurality of touch lines, and the plurality of fingerprint identification signal lines is electrically connected to the plurality of fingerprint identification units. The fourth metal layer arranged in the fan-shaped wiring area comprises at least one of the plurality of fingerprint identification signal lines.

In a second aspect, the present disclosure further provides a display panel including the array substrate provided in the first aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. Other embodiments obtained by those skilled in the art shall fall into the protection scope of the present disclosure.

The terms used in the embodiments of the present disclosure are merely describing exemplary embodiments and not intended to limit the present disclosure. Unless otherwise noted in the context, the expressions "a", "an". "the" and "said" in singular form in the embodiments and appended claims of the present disclosure are also intended to represent a plural form.

In the description of the specification, it should be understood that the terms "substantially", "approximately", "about", "rough", and "roughly" described in the claims and embodiments of the present disclosure refer to a reasonable value within a range of process operation or tolerance that can be basically approved of rather than an exact value.

It should be understood that although the terms "first", "second", "third", etc., may be used to describe display areas in the embodiments of the present disclosure, these display areas should not be limited to these terms. These terms are only used to distinguish display areas from each other. For example, without departing from the scope of the embodiments of the present disclosure, a first display area can also be referred to as a second display area, and similarly, a second display area can also be referred to as a first display area.

The applicant of the present disclosure provides a solution to the problems present in related art.

Figure 1:
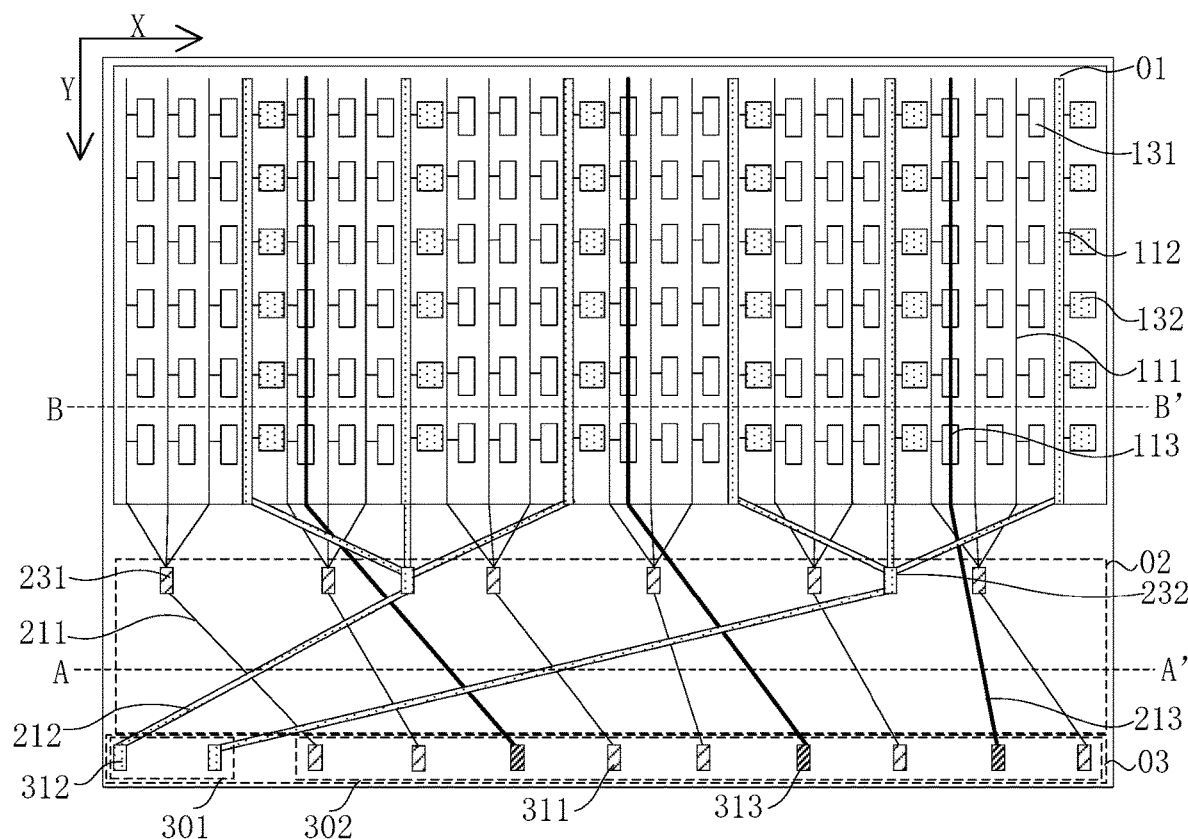
FIG. 1 is a schematic diagram of an array substrate according to an embodiment of the present disclosure.
Figure 2:
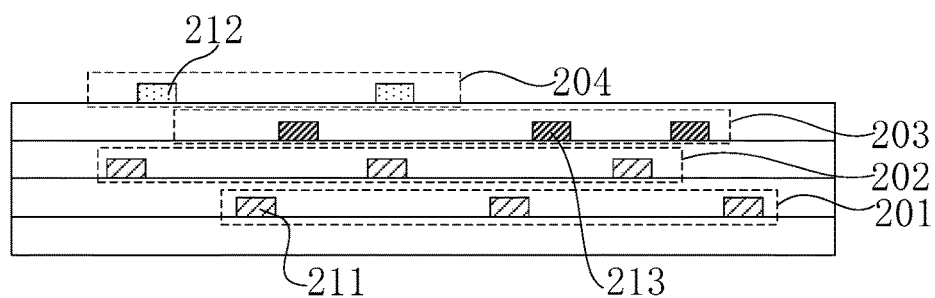
FIG. 2 is a cross-sectional view of a fan-shaped wiring area taken along a direction AA according to an embodiment of the present disclosure.
Figure 3:
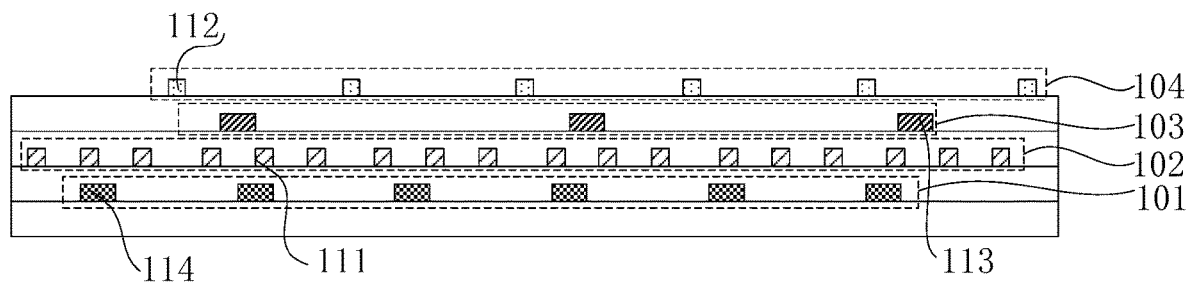
FIG. 3 is a cross-sectional view of a display area taken along a direction BB' direction according to an embodiment of the present disclosure.

This disclosure provides an array substrate, as shown in FIG. 1, FIG. 2, and FIG. 3. FIG. 1 is a schematic diagram of an array substrate according to an embodiment of the disclosure. FIG. 2 is a cross-sectional view of a fan-shaped wiring area taken along a direction AA according to an embodiment of the present disclosure. FIG. 3 is a cross-sectional view of a display area taken along a direction BB' according to an embodiment of the present disclosure. Referring to FIG. 1, the array substrate has a display area 01 and a fan-shaped wiring area 02. A first metal layer, a second metal layer, and a third metal layer are arranged in both the display area 01 and the fan-shaped wiring area 02. Referring to FIG. 3, a first metal layer 101, a second metal layer 102, and a third metal layer 103 are arranged in the display area 01, and the first metal layer 101 that is arranged in the display area 01 includes gate lines 114. The second metal layer 102 arranged in the display area 01 includes data lines 111, and the third metal layer 103 arranged in the display area 01 includes touch lines 113. Referring to FIG. 2, a first metal layer 201, a second metal layer 202, and a third metal layer 203 are arranged in the fan-shaped wiring area 02. Further, a fourth metal layer 204 is arranged in the fan-shaped wiring area. It should be noted that an insulating layer is provided between the metal layers.

Referring to FIG. 1 and FIG. 3, a plurality of display units 131 and touch units are arranged in the display area 01. The data lines 111 are configured to provide a light-emitting signal for the display units 131, the gate lines 114 are configured to control transistors arranged in the display area 01 to be turned on or turned off, and the touch lines 113 are configured to provide a touch signal to the touch units arranged in the display area 01. Furthermore, a plurality of fingerprint identification lines 112 and a plurality of fingerprint identification units 132 are arranged in the display area 01. The fingerprint identification lines 112 are configured to transmit signals related to the fingerprint identification to the fingerprint identification units 132, such as a self-induction fingerprint identification signal generated by the fingerprint identification unit 132 arranged in the display area 01.

Referring to FIG. 1 and FIG. 2, data signal lines 211, touch signal lines 213, and fingerprint identification signal lines 212 are arranged in the fan-shaped wiring area 02. At least one of the fingerprint identification signal lines 212 is located in the fourth metal layer 204 arranged in the fan-shaped wiring area 02. That is, the fourth metal layer 204 arranged in the fan-shaped wiring area 02 includes at least one of the fingerprint identification signal lines 212. The fingerprint identification unit 132 is electrically connected to the fingerprint identification signal line 212. For example, the fingerprint identification signal line 212 is electrically connected to the fingerprint identification unit 132 through the fingerprint identification line 112. Furthermore, the data signal line 211 is electrically connected to the data line 111, and the touch signal line 213 is electrically connected to the touch line 113.

The fourth metal layer 204 is provided in the fan-shaped wiring area 02, and at least one of the fingerprint identification signal lines 212 is provided in the fourth metal layer 204 arranged in the fan-shaped wiring area 02. In this manner, excessive fingerprint identification signal lines 212 is not located in the same layer as other signal lines, thus reducing a density of fingerprint identification signal lines 212 in one metal layer in the fan-shaped wiring area 02 or a density of other signal lines in one metal layer. An inclination (angle) of the fingerprint identification signal line 212 in the fan-shaped wiring area can be appropriately increased, which reduces a height of the fan-shaped wiring area 02.

Referring to FIG. 1, the array substrate provided in the present disclosure further has a bonding area 03. A first-type bonding pad 311, a second-type bonding pad 312, and a third-type bonding pad 313 are arranged in the bonding area 03. The first-type bonding pad 311 is electrically connected to the data signal line 211. The second-type bonding pad 312 is electrically connected to the fingerprint identification signal line 212. The third-type bonding pad 313 is electrically connected to the touch signal line 213. It can be understood that the fan-shaped wiring area 02 is located between the display area 01 and the bonding area 03, that is, the display area 01, the fan-shaped wiring area 02, and the bonding area 03 are arranged along a first direction Y. The data signal line 211 arranged in the fan-shaped wiring area 02 is configured to transmit a signal received by the first-type bonding pad 311 to a corresponding data line 111. The fingerprint identification signal line 212 arranged in the fan-shaped wiring area 02 is configured to transmit a signal related to the fingerprint identification between the second-type bonding pad 312 and the fingerprint identification line 112. The touch signal line 213 arranged in the fan-shaped wiring area 02 is configured to transmit a signal related to touch sensing between the third-type bonding pad 313 and touch line113.

In an embodiment of the present disclosure, the first-type bonding pads 311 and the second-type bonding pads 312 are disposed along a second direction X, the second direction X intersects the first direction Y. and the first direction Y is a direction along which the display area 01 and the fan-shaped wiring area 02 are arranged. Referring to FIG. 1, the first-type bonding pads 311 are disposed in a first area 302 of the bonding area 03, and the second-type bonding pads 312 are disposed in a second area 301 of the bonding area 03. The first area 302 and the second area 301 are arranged along the second direction X. In an embodiment, the third-type bonding pads 313 can also be disposed in the first area 302. The first-type bonding pad 311 for connecting the data signal line 211 is disposed in the first area 302, and the second-type bonding pad 312 for connecting the fingerprint identification signal line 212 is disposed in the second area 301, and the first area 302 is spaced from the second area 301. Therefore, a flexible circuit board for display can be bound to the first area 302, and a flexible circuit board for fingerprint identification can be bound to the second area 301, without having to develop a new flexible circuit board to integrate a display function and a fingerprint identification function.

In an embodiment of the present disclosure, referring to FIG. 3, the display area 01 may further include a fourth metal layer 104 that is arranged in the display area 01 to include fingerprint identification lines 112. That is, the fourth metal layer 104 is also provided in the display area 01, and at least one of the plurality of fingerprint identification lines 112 is provided in the fourth metal layer 104 arranged in the display area 01. By providing the fourth metal layer 104 in the display area 01 and providing the at least one of the fingerprint identification lines 112 in the fourth metal layer 104, disposing excessive fingerprint identification lines 112 in the same layer with other signal lines is avoided, thereby reducing a crosstalk between different signal lines.

In an embodiment of the present disclosure, referring to FIG. 2 and FIG. 3, the fingerprint identification lines 112 are located in the fourth metal layer 104, and the fingerprint identification signal lines 212 are located in the fourth metal layer 204. That is, all fingerprint identification lines 112 and all fingerprint identification signal lines 212 are located in the fourth metal layer. In an embodiment, all fingerprint identification lines 112 are located in the fourth metal layer 104 arranged in the display area 01, and all fingerprint identification signal lines 212 are located in the fourth metal layer 204 arranged in the fan-shaped wiring area 02. In an embodiment, a relatively large number of data signal lines 211 is arranged in the fan-shaped wiring area 02, and thus needs to be alternately disposed in the first metal layer 201 and the second metal layer 202. When all the fingerprint identification signal lines 212 are disposed in the fourth metal layer 204 arranged in the fan-shaped wiring area 02, the touch signal lines 213 can be disposed in the third metal layer 203 arranged in the fan-shaped wiring area 02 without occupying the first metal layer 201 and the second metal layer 202. In this way, the data signal line 211, the fingerprint identification signal line 212, and the touch signal line 213 are respectively disposed in corresponding metal layers, and a density of signal lines in each metal layer is not too high, which reduces an interference between different signal lines and decreases the height of the fan-shaped wiring area 02.

Figure 4:
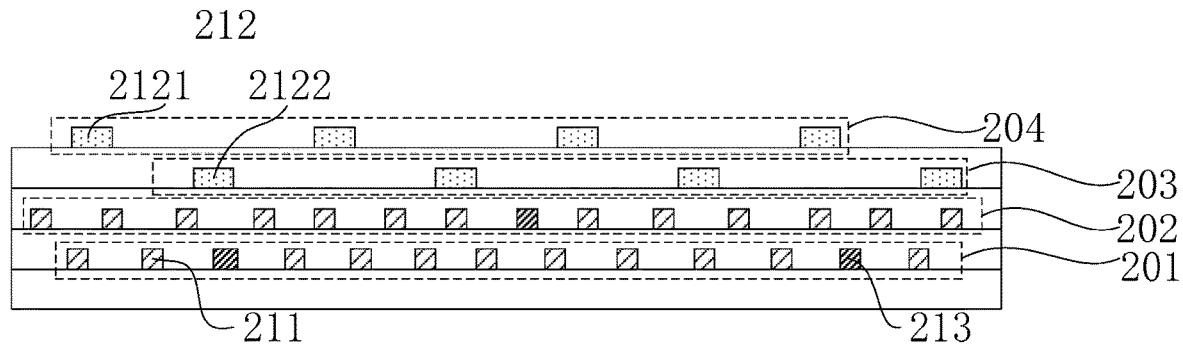
FIG. 4 is a cross-sectional view of a fan-shaped wiring area according to another embodiment of the present disclosure.

FIG. 4 is a cross-sectional view of a fan-shaped wiring area according to another embodiment of the present disclosure. In an embodiment of the present disclosure, referring to FIG. 4, the fingerprint identification signal lines 212 includes first-type fingerprint identification signal lines 2121 and second-type fingerprint identification signal lines 2122. The first-type fingerprint identification signal lines 2121 are located in the fourth metal layer 204, and the second-type fingerprint identification signal lines 2122 are located in at least one layer of the first metal layer 201, the second metal layer 202, and the third metal layer 203. That is, the fingerprint identification signal lines 212 are distributed in different metal layers in the fan-shaped wiring area 02. When a relatively large number of fingerprint identification signal lines 212 is arranged in the fan-shaped wiring area 02, some fingerprint identification signal lines 212 may be disposed in the fourth metal layer 204, and the remaining fingerprint identification signal lines 212 may be disposed in other metal layers to reduce the number of signal lines in each metal layer having the fingerprint identification signal line 212, thereby reducing the height of the fan-shaped wiring area 02.

Figure 5:
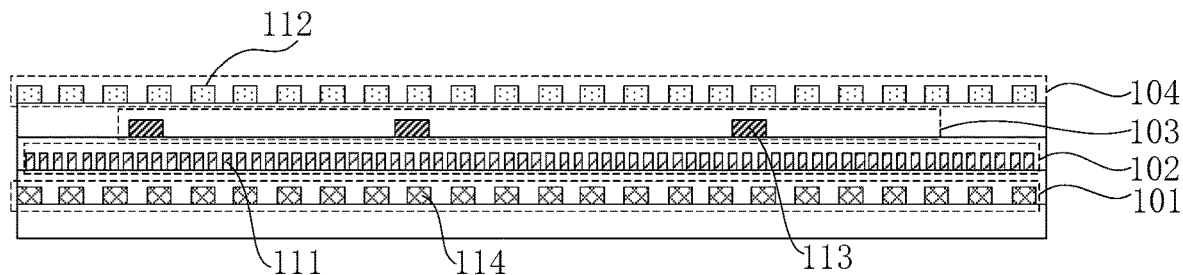
FIG. 5 is a cross-sectional view of a display area according to another embodiment of the present disclosure.

FIG. 5 is a cross-sectional view of a display area according to another embodiment of the present disclosure. Referring to FIG. 5, it can be seen that, in the display area 01, the fingerprint identification line 112 electrically connected to the fingerprint identification signal line 212 is disposed in the fourth metal layer 104 of the display area 01, the touch lines 113 are disposed in the third metal layer 103 of the display area 01, the data lines 111 are disposed in the second metal layer 102 of the display area 01, and the gate lines 114 are disposed in the first metal layer 101 of the display area 01. That is, in the display area 01, the fingerprint identification lines 112 are all arranged in one corresponding metal layer, the touch lines 113 are all arranged in one corresponding metal layer, the data lines 111 are all arranged in one corresponding metal layer, and the gate lines 114 are all arranged in one corresponding metal layer. However, in the fan-shaped wiring area, the fingerprint identification signal lines 212 may be disposed in different metal layers, in order to reduce the density of the fingerprint identification signal lines 212 in a single metal layer and to reduce the height of the fan-shaped wiring area 02.

In an embodiment of the present disclosure, the fingerprint identification signal lines 212 are distributed in different metal layers in the fan-shaped wiring area 02, and the first-type fingerprint identification signal lines 2121 and the second-type fingerprint identification signal lines 2122 are alternately arranged. That is, when one fingerprint identification signal line 212 is arranged in the fourth metal layer 204, each fingerprint identification signal line 212 adjacent to the one fingerprint identification signal line 212 is arranged in another metal layer. When one fingerprint identification signal line 212 is arranged in at least one of the first metal layer 201, the second metal layer 202, and the third metal layer 203, each fingerprint identification signal line 212 adjacent to the one fingerprint identification signal line 212 is arranged in the fourth metal layer 204. By alternately arranging the first-type fingerprint identification signal lines 2121 and the second-type fingerprint identification signal lines 2122, a distance between the fingerprint identification signal lines 212 that are adjacently arranged in a same metal layer can be increased, which improves a process yield and reduces a signal interference between different fingerprint identification signal lines 212.

In an embodiment of the present disclosure, referring to FIG. 4, the second-type fingerprint identification signal lines 2122 may be located in the third metal layer 203. That is, the first-type fingerprint identification signal lines 2121 are arranged in the fourth metal layer 204 of the fan-shaped wiring area 02, and the second-type fingerprint identification signal lines 2122 are arranged in the third metal layer 203 of the fan-shaped wiring area 02. In an embodiment, in the fan-shaped wiring area 02, the fingerprint identification signal lines 212 can be alternately disposed in the third metal layer 203 and the fourth metal layer 204 in sequence.

In an embodiment of the present disclosure, the second-type fingerprint identification signal lines 2122 are disposed in the third metal layer 203, and the fourth metal layer 204 has a same conductivity as the third metal layer 203, thereby ensuring that the first-type fingerprint identification signal lines 2121 and the second-type fingerprint identification signal lines 2122 have a same conductivity, therefore ensuring uniformity of an accuracy of the fingerprint identification. In order to ensure that the fourth metal layer 204 and the third metal layer 203 have a same conductivity, the third metal layer 203 and the fourth metal layer 204 may be made of a same material and may have a same thickness. It can be understood that when the second-type fingerprint identification signal lines 2122 are arranged in the first metal layer 201 or the second metal layer 202, the fourth metal layer 204 may also have a same conductivity as the metal layer where the second-type fingerprint identification signal lines 2122 are located. By assuring that the metal layer where the second-type fingerprint identification signal lines 2122 are located has a same conductivity as a film layer containing the metal layer where the first-type fingerprint identification signal lines 2121 are located, uniformity of signal transmission related to the fingerprint identification is ensured.

In an embodiment of the present disclosure, referring to FIG. 4, the second-type fingerprint identification signal lines 2122 and the first-type fingerprint identification signal lines 2121 are disposed in the third metal layer 203 and the fourth metal layer 204, respectively, and the data signal lines 211 and the touch signal lines 213 are disposed in the first metal layer 201 and the second metal layer 202. In an embodiment, the data signal lines 211 and the touch signal lines 213 are regarded as a whole, and these data signal lines 211 and these touch signal lines 213 can be alternately disposed in the first metal layer 201 and the second metal layer 202 of the fan-shaped wiring area 02. In an embodiment, the number of the data signal lines 211 is greater than the number of the touch signal lines 213. Therefore, multiple data signal lines 211 correspond to one touch signal line 213. Generally, a display function and a touch function of the array substrate are performed in a time-division manner, and even if the data signal line 211 and the touch signal line 213 for respectively realizing the two functions are provided in the same layer, basically no signal interference occurs therebetween because the two functions transmit signals in a time-division manner.

Figure 6:
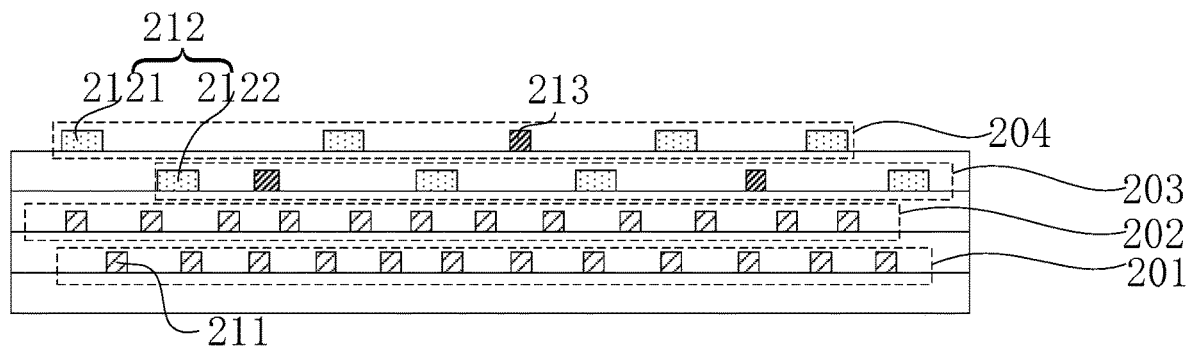
FIG. 6 is a cross-sectional view of a fan-shaped wiring area according to another embodiment of the present disclosure.

FIG. 6 is a cross-sectional view of a fan-shaped wiring area according to another embodiment of the present disclosure. In the embodiment, referring to FIG. 6, the fingerprint identification signal lines 212 and the touch signal lines 213 are disposed in the third metal layer 203 and the fourth metal layer 204. In an embodiment, the fingerprint identification signal lines 212 and the touch signal lines 213 are regarded as a whole, and the fingerprint identification signal lines 212 and the touch signal lines 213 can be alternately disposed in the third metal layer 203 and the fourth metal layer 204 of the fan-shaped wiring area 02. Generally, a relatively small number of touch signal lines 213 is included, and the touch signal lines 213 are located in a same metal layer with the fingerprint identification signal lines 212, and even though the touch signal lines 213 and the fingerprint identification signal lines 212 are disposed in different layers, the density of the fingerprint identification signal lines 212 in each metal layer does not increase excessively, which can limit the height of the fan-shaped wiring area 02.

Figure 7:
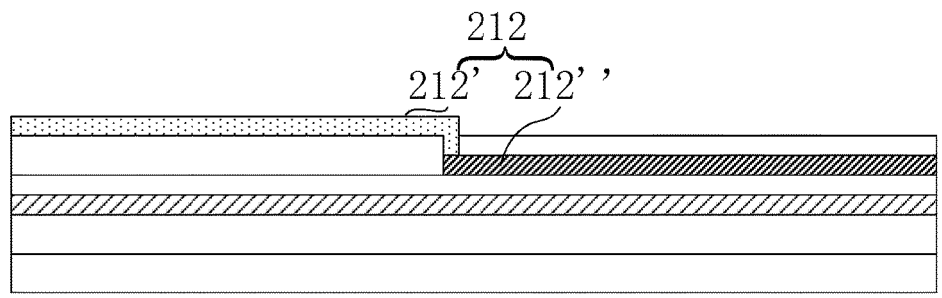
FIG. 7 is a cross-sectional view of a fingerprint identification signal line according to an embodiment of the present disclosure.

FIG. 7 is a cross-sectional view of a fingerprint identification signal line according to an embodiment of the present disclosure. In an embodiment of the present disclosure, referring to FIG. 7, each fingerprint identification signal line 212 includes a first portion 212' and a second portion 212" that are electrically connected to each other. The first portion 212' is located in the fourth metal layer 204 and the second portion 212" is located in at least one of the first metal layer 201, the second metal layer 202, and the third metal layer 203. As shown in FIG. 7, the first portion 212' of the fingerprint identification signal line 212 is located in the fourth metal layer 204 of the fan-shaped wiring area 02, and the second portion 212" is located in the third metal layer 203 of the fan-shaped wiring area 02. The first portion 212' and the second portion 212" are electrically connected to each other. It should be noted that among two adjacent fingerprint identification signal lines 212, the first portion 212' of one fingerprint identification signal line 212 is adjacent to the second portion of the other fingerprint identification signal line 212, and the second portion 212" of the one fingerprint identification signal line 212 is adjacent to the first portion 212' of the other fingerprint identification signal line 212. In this way, it is ensured that there is no short circuit between the two adjacent fingerprint identification signal lines 212, and a distance therebetween can also be set small or the two adjacent fingerprint identification signal lines 212 partially overlap, thereby reducing the height of the fan-shaped wiring area.

Continuing to refer to FIG. 1, first multiplexers 232 are provided in the fan-shaped wiring area 02. An output terminal of the first multiplexer 232 is electrically connected to the fingerprint identification signal line 212, and an input terminal of the first multiplexer 232 is electrically connected to the fingerprint identification line 112. That is, the first multiplexer 232 is configured to control whether and when a signal of the fingerprint identification line 112 is transmitted to the fingerprint identification signal line 212. In an embodiment, referring to FIG. 1, the input terminal of the first multiplexer 232 may be connected to three fingerprint identification lines 112, and the output terminal of the first multiplexer 232 may be connected to one fingerprint identification signal line 212. Therefore, the first multiplexer 232 can be further configured to control an order in which the signals in the three fingerprint identification lines 112 that are connected to its input terminal are transmitted through the fingerprint identification signal line 212. It should be noted that FIG. 1 only shows an example in which a ratio of the number of the fingerprint identification line 112 connected to the input terminal of the first multiplexer 232 and the number of the fingerprint identification signal lines 212 connected to the output terminal of the first multiplexer 232 is 3:1. i.e., a ratio of the input terminal to the output terminal of the first multiplexer 232 is 3:1. The illustrated ratio is only one embodiment, and those skilled in the art can set the ratio of input terminal to the output terminal of the first multiplexer 232 to other ratios. In an embodiment of the present disclosure, the number of the input terminals of the first multiplexer 232 is greater than the number of the output terminals of the first multiplexer 232. By providing the first multiplexer 232 between the fingerprint identification signal line 212 and the fingerprint identification line 112, the signals related to the fingerprint identification generated by the fingerprint identification unit 132 in the display area 01 can be transmitted to an external control circuit in a time-division manner to perform corresponding operations, and meanwhile the number of the fingerprint identification signal lines 212 and the density of the fingerprint identification signal lines 212 in the metal layer can be reduced. Therefore, the inclination of the fingerprint identification signal line 212 can be appropriately increased, i.e., an included angle between the fingerprint identification signal line 212 and the first direction Y can be increased, thereby reducing the height of the fan-shaped wiring area 02.

In an embodiment, referring to FIG. 1, second multiplexers 231 are provided in the fan-shaped wiring area. An input terminal of the second multiplexer 231 is electrically connected to the data signal line 211, and the output terminal of the second multiplexer 231 is electrically connected to the data line 111. That is, the second multiplexer 231 is configured to control whether and when the signal of the data signal line 211 is transmitted to the data line 111. In an embodiment, referring to FIG. 1, the input terminal of the second multiplexer 231 may be connected to one data signal line 211, and the output terminal of the second multiplexer 231 may be connected to three data lines 111. Therefore, the second multiplexer 231 can be further configured to control an order in which the three data lines 111 connected to its output terminal receive a signal in the data signal line 211. Generally, the number of the input terminals of the second multiplexer 231 is smaller than the number of the output terminals of the second multiplexer 231. By providing the second multiplexer 231 between the data signal line 211 and the data line 111, it is allowed that display signals from the external control circuit are transmitted to the display units 131 in the display area 01 in a time-division manner.

In view of the above, in an embodiment of the present disclosure, the first multiplexer 232 is configured to control the signals related to the fingerprint identification in the display area 01 to be transmitted to the external control circuit in a time-division manner. The second multiplexer 231 is configured to control display signals from the external control circuit to be received in the display area in a time-division manner.

Figure 8:
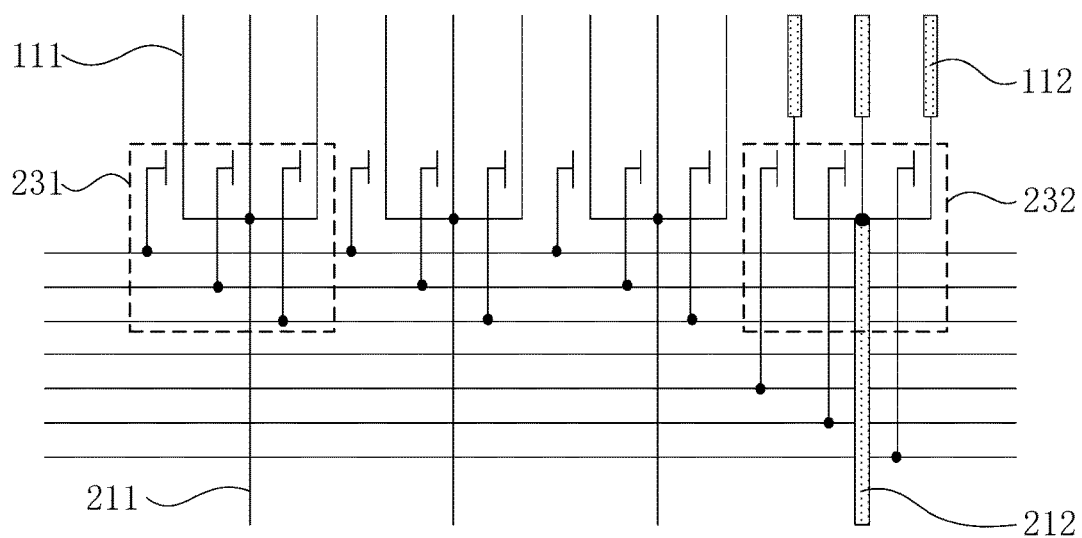
FIG. 8 is a partial enlarged view of a fan-shaped wiring area according to an embodiment of the present disclosure.
Figure 9:
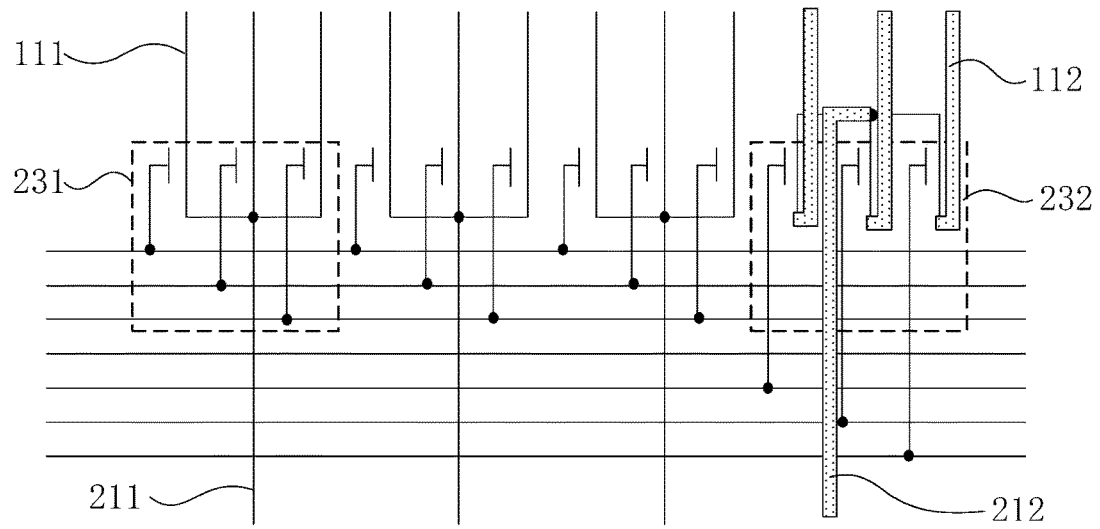
FIG. 9 is a partial enlarged view of a fan-shaped wiring area according to another embodiment of the present disclosure.

FIG. 8 is a partial enlarged view of a fan-shaped wiring area according to an embodiment of the present disclosure, and FIG. 9 is a partial enlarged view of a fan-shaped wiring area according to another embodiment of the present disclosure.

In an embodiment of the present disclosure, as shown in FIG. 8, the input terminal of the first multiplexer 232 is located at a side of the first multiplexer 232 close to the display area 01, and the output terminal of the first multiplexer 232 is located at a side of the first multiplexer 232 close to the fan-shaped wiring area 02. That is, a connection point of the fingerprint identification line 112 to the first multiplexer 232 is located at the side of the first multiplexer 232 close to the display area 01, and a connection point of the fingerprint identification signal line 212 to the first multiplexer 232 is located at a side of the first multiplexer 232 away from the display area 01. In another embodiment of the present disclosure, as shown in FIG. 9, the output terminal of the first multiplexer 232 is located at the side of the first multiplexer 232 close to the display area 01, and the input terminal of the first multiplexer 232 is located at the side of the first multiplexer away from the display area. That is, the connection point of the fingerprint identification line 112 to the first multiplexer 232 is located at the side of the first multiplexer 232 away from the display area 01, and the connection point of the fingerprint identification signal line 212 to the first multiplexer 232 is located at the side of the first multiplexer 232 close to the display area 01. When the connection point of the fingerprint identification signal line 212 to the first multiplexer 232 is located at the side of the first multiplexer 232 close to the display area 01, a total height of the fingerprint identification signal line 212 in the fan-shaped wiring area 02 in the Y direction partially overlaps a height of the first multiplexer 232 in the Y direction. That is, the height of the fingerprint identification signal line 212 reuses the height of the first multiplexer 232, which is conducive to reducing the height of the first multiplexer 232.

As shown in FIG. 8 and FIG. 9, according to actual requirements, the first multiplexer 232 may be set upside or upside down. FIG. 8 illustrates a case where the first multiplexer 232 is set upside, such that the input terminal of the first multiplexer 232 connected to three fingerprint identification lines 112 is close to the display area 01, and the output terminal of the first multiplexer 232 connected to one fingerprint identification signal line 212 is close to the fan-shaped wiring area 02. That is, a terminal of the first multiplexer 232 connected to a bigger number of signal lines is close to the display area 01, and a terminal of the first multiplexer 232 connected to a smaller number of signal lines is close to fan-shaped wiring area 02. FIG. 9 illustrates a case where the first multiplexer 232 is set upside down, such that the input terminal of the first multiplexer 232 connected to three fingerprint identification lines 112 is close to the fan-shaped wiring area 02, and the output terminal of the first multiplexer 232 connected to one fingerprint identification signal line 212 is close to the display area 01. That is, the terminal of the first multiplexer 232 connected to a bigger number of signal lines is close to the fan-shaped wiring area 02, and the terminal of the first multiplexer 232 connected to a smaller number of signal lines is located close to the display area 01.

In an embodiment, referring to FIG. 8 and FIG. 9, the input terminal of the second multiplexer 231 is located at the side of the second multiplexer 231 away from the display area 01, and the output terminal of the second multiplexer 231 is located at the side of the second multiplexer 231 close to the display area 01. That is, a connection point of the data signal line 211 to the second multiplexer 231 is located at a side away from the display area 01, and a connection point of the data line 111 to the second multiplexer 231 is located at a side close to the display area 01. As shown in FIG. 8 and FIG. 9, the second multiplexer 231 may be set upside, for example, the output terminal of the second multiplexer 231 connected to three data lines 111 is close to the display area 01, and the input terminal of the second multiplexer 231 connected to one data signal line 211 is close to the fan-shaped wiring area 02. That is, a terminal of the second multiplexer 231 connected to a bigger number of signal lines is close to the display area 01, and a terminal of the second multiplexer 231 connected to a smaller number of signal lines is close to the fan-shaped wiring area 02.

As shown in FIG. 8, the first multiplexer 232 which is set upside has a same structure as the second multiplexer 231, which simplifies the process and is easy to implement.

Figure 10:
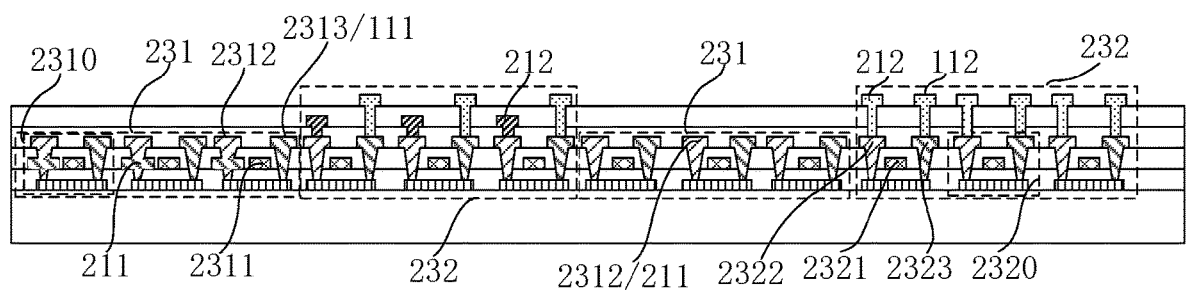
FIG. 10 is a sectional view of a first multiplexer and a second multiplexer.

FIG. 10 is a cross-sectional view of the first multiplexer and the second multiplexer.

The first multiplexer 232 includes a plurality of first transistors 2320. A gate electrode 2321 of the first transistor 2320 is located in the first metal layer 201, and a source electrode 2322 and a drain electrode 2323 of the first transistor 2320 are located in the second metal layer 202. In an embodiment, the source electrode 2322 of the first transistor 2320 is electrically connected to the fingerprint identification signal line 212, and the drain electrode 2323 of the first transistor 2320 is electrically connected to the fingerprint identification line 112. It should be noted that the fingerprint identification signal lines 212 can be alternately disposed in the third metal layer 203 and the fourth metal layer 204. For example, the fingerprint identification signal line 212 connected to the first multiplexer 232 of the left side is located in the third metal layer 203, and the fingerprint identification signal line 212 connected to the first multiplexer 232 of the right side is located in the fourth metal layer 204.

The second multiplexer 231 includes a plurality of second transistors 2310. A gate electrode 2311 of the second transistor 2310 is located in the first metal layer 201, and a source electrode 2312 and a drain 2313 of the second transistor 2310 are located in the second metal layer 202. In an embodiment, the source electrode 2312 of the second transistor 2310 is electrically connected to the data signal line 211, and the drain electrode 2313 of the second transistor 2310 is electrically connected to the data line 111. It should be noted that the data signal lines 211 can be alternately disposed in the first metal layer 201 and the second metal layer 202. For example, the data signal line 211 connected to the second multiplexer 231 of the left side is located in the first metal layer 201, and the data signal line 211 connected to the second multiplexer 231 of the right side is located in the second metal layer 202.

As described above, in an embodiment of the present disclosure, the first multiplexer 232 and the second multiplexer 231 have a same structure and are located in a same layer. Since the first multiplexer 232 and the second multiplexer 231 have the same structure and are co-located in the same film layer, the two can be prepared simultaneously to ensure easy process realization and simple process.

Figure 11:
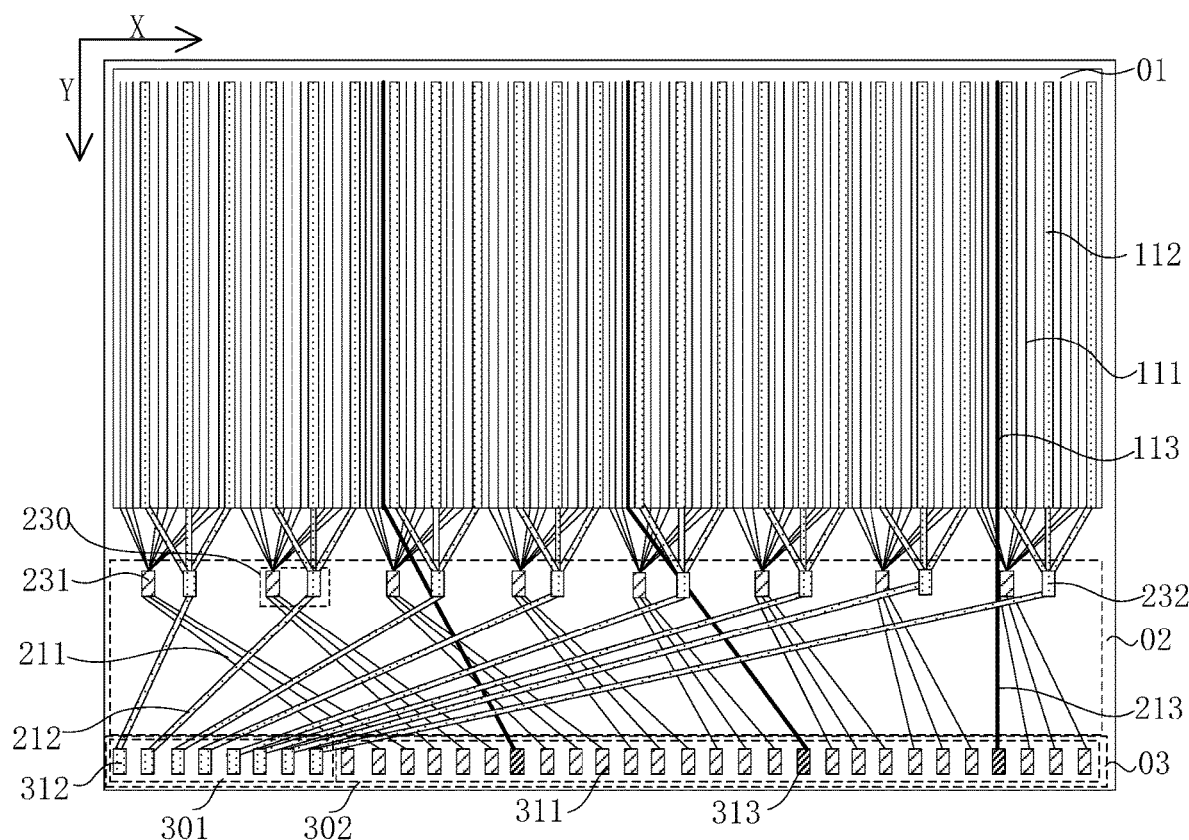
FIG. 11 is a schematic diagram of an array substrate according to another embodiment of the present disclosure.

It should be noted that the ratio of the number of the data signal line 211 connected to the input terminal of the second multiplexer 231 to the number of the data lines 111 connected to the output terminal of the second multiplexer 231 is 1:3, that is, the ratio of the input terminal to the output terminal of the second multiplexer 231 is 1:3. This ratio is only an example. Those skilled in the art can design the ratio of the input terminal of the second multiplexer 231 to the output terminal of the second multiplexer 231 to be another value. FIG. 11 is a schematic diagram of an array substrate according to another embodiment of the present disclosure. In this embodiment, as shown in FIG. 11, the ratio of the number of the data signal lines 211 connected to the input terminal of the second multiplexer 231 to the number of the data lines 111 connected to the output terminal of the second multiplexer 231 is 3:9.

Figure 12:
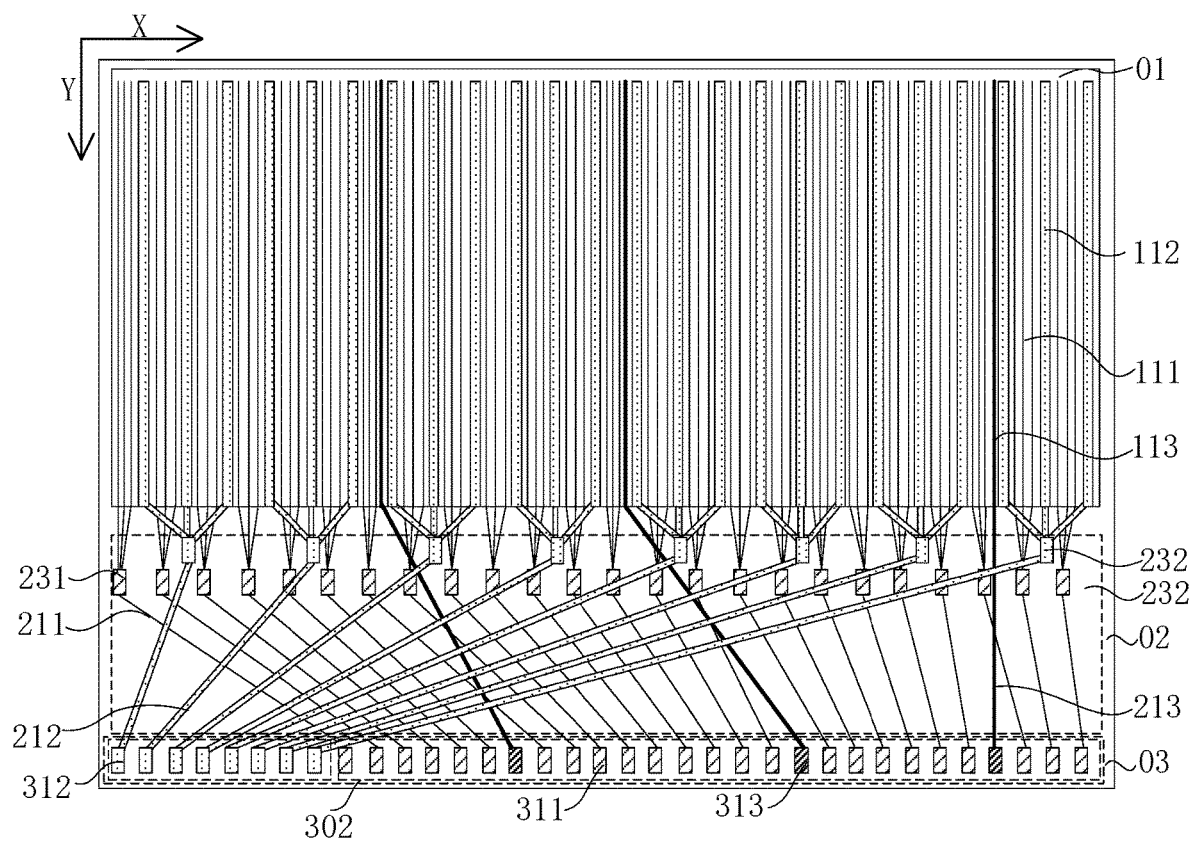
FIG. 12 is a schematic diagram of an array substrate according to another embodiment of the present disclosure.

FIG. 12 is a schematic diagram of an array substrate according to another embodiment of the present disclosure. In an embodiment of the present disclosure, as shown in FIG. 12, the first multiplexers 232 and the second multiplexers 231 are arranged along the first direction Y, the first direction Y being a direction along which the display area and the fan-shaped wiring area are arranged. As shown in FIG. 12, the first multiplexers 232 are arranged at upper positions and the second multiplexers 231 are arranged at lower positions. It should be noted that according to actual needs, the first multiplexer 232 may be arranged below the second multiplexers 231. That is, the first multiplexers 232 are located between the second multiplexers 231 and the display area 01, or the second multiplexers 231 are located between the first multiplexers 232 and the display area 01, which is not specifically limited herein. Since the first multiplexers 232 are located in a different row than the second multiplexers 231, the first multiplexers 232 can be arbitrarily arranged based on needs. In an embodiment, the first multiplexers 232 are arranged to be beneficial to increase of the inclination of the fingerprint identification signal line 212, i.e., increase of the included angle between the fingerprint identification signal line 212 and the first direction Y, thereby reducing the height of the fan-shaped wiring area 02.

In an embodiment of the present disclosure, at least one first multiplexer 232 and at least one second multiplexer 231 constitute a repeating unit, where the second direction X intersects the first direction Y, and the first direction Y is the direction along which the display area 01 and the fan-shaped wiring area 02 are arranged.

In another embodiment of the present disclosure, one first multiplexer 232 and one second multiplexer 231 constitute a repeating unit arranged along the second direction X. Referring to FIG. 11, one first multiplexer 232 and one second multiplexer 231 adjacent to the first multiplexer 232 constitute a repeating unit 230 arranged along the second direction X.

Figure 13:
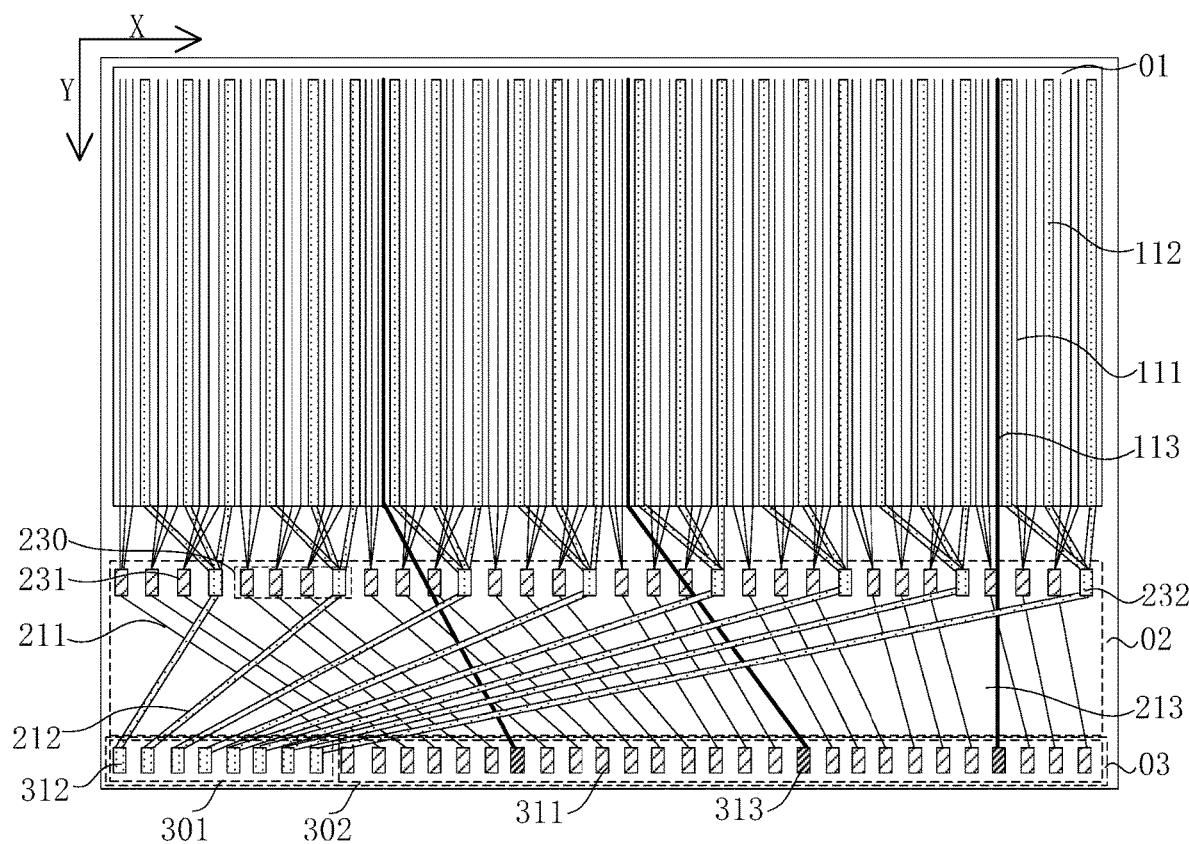
FIG. 13 is a schematic diagram of an array substrate according to another embodiment of the present disclosure.

FIG. 13 is a schematic diagram of an array substrate according to another embodiment of the present disclosure. Referring to FIG. 13, one first multiplexer 232 and at least two second multiplexers 231 constitute a repeating unit 230 arranged along the second direction X. As shown in FIG. 13, one first multiplexer selection 232 and three second multiplexers 231 constitute repeating unit 230, and the repeating units are sequentially arranged along the second direction X. It should be noted that the number of the first multiplexers 232 and the number of the second multiplexers 231 in one repeating unit can be set according to actual needs. In the display area 01, in some embodiments there is a certain regularity between the arrangement of the fingerprint identification units 132 and at least one display units 131. For example, three columns of display units 131 correspond to one column of fingerprint identification units 132. When there is a regularity between the display units 131 and the fingerprint identification units 132, the second multiplexers 231 and the first multiplexers 232 can also be designed with a regularity. Setting the first multiplexers 232 and the second multiplexers 231 in the same row can prevent the two from occupying too much the height of the fan-shaped wiring area 02.

Figure 14:
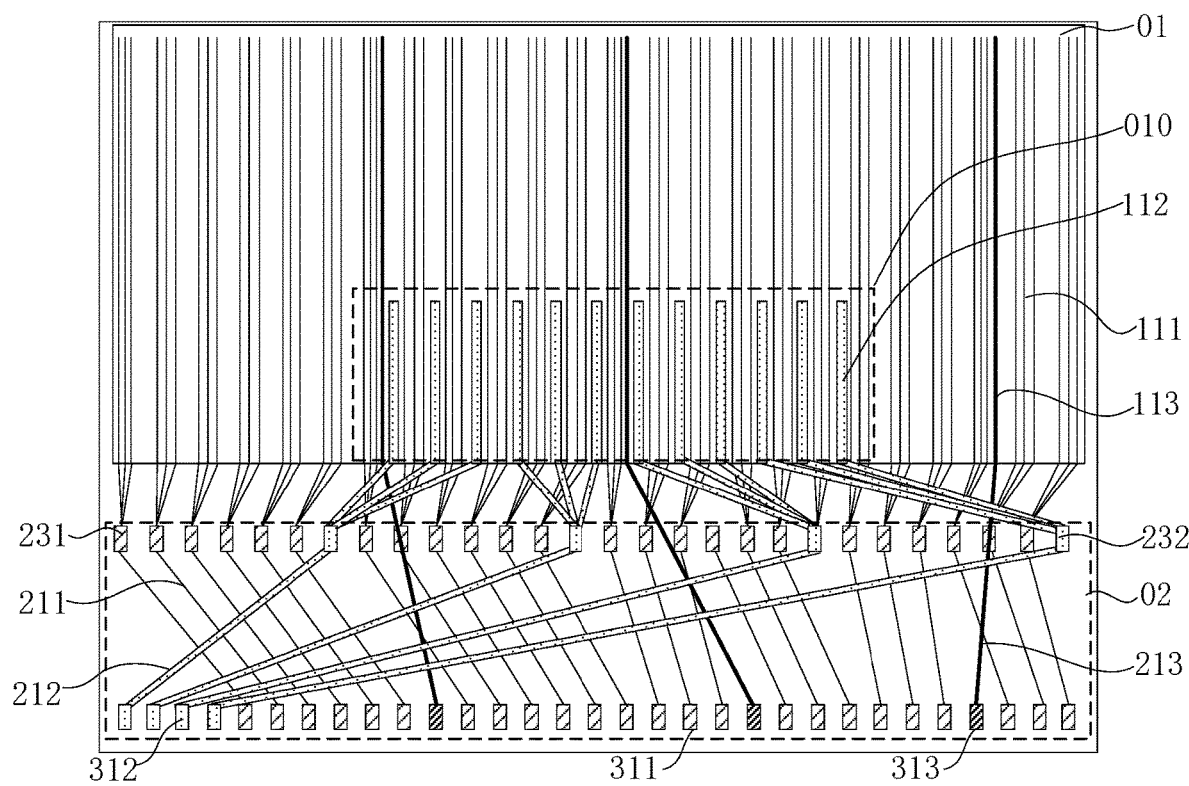
FIG. 14 is a schematic diagram of an array substrate according to another embodiment of the present disclosure.

FIG. 14 is a schematic diagram of an array substrate according to another embodiment of the present disclosure. In an embodiment of the present disclosure, as shown in FIG. 14, the fingerprint identification lines 112 may be arranged only in a partial area 010 of the display area 01, that is, the fingerprint identification units 132 are located only in a part of the display area 01. For an array substrate that does not require a full screen fingerprint identification function, the fingerprint identification units may be disposed only in a partial area 010 of the display area 01, and the number of corresponding fingerprint identification lines 112 and fingerprint identification signal lines 212 is reduced.

In another embodiment, as shown in FIG. 1 and FIGS. 11-13, the fingerprint identification signal lines can be uniformly disposed in the display area 01, that is, the fingerprint identification units 132 are uniformly disposed in the display area 01. Uniformly disposing the fingerprint identification units 132 in the display area 01 can achieve the fingerprint identification function on an entire surface in the display area 01 of the display panel.

It should be noted that when the fingerprint identification units 132 are only provided in a part of the display area 01, the number of the fingerprint identification lines 112 is relatively small. Therefore, the number of the fingerprint identification signal lines 212 in the fan-shaped wiring area 02 is also relatively small. Thus, the first multiplexer 232 may not be provided in the fan-shaped wiring area 02. In order to further reduce the number of the fingerprint identification signal lines 212 in the fan-shaped wiring area 02, the first multiplexer can be provided as needed, but in this case, the number of the data signal lines 211 is usually greater than the number of the fingerprint identification signal lines 212. Therefore, it can be set in an embodiment that one first multiplexer 232 and at least two second multiplexers 231 constitute a repeating unit 230 arranged along the second direction X.

It should be noted that when the fingerprint identification units 132 are uniformly arranged in the display area 01, the number of the fingerprint identification lines 112 is usually relatively big, so the number of the fingerprint identification signal lines 212 in the fan-shaped wiring area 02 is also relatively big. In this case, the first multiplexer 232 can be provided in the fan-shaped wiring area 02 as required. It is also possible that the first multiplexer 232 is not arranged in the fan-shaped wiring area according to the actual situation and the requirement on the width of the fan-shaped wiring area. When the number of the fingerprint identification signal lines 212 in the fan-shaped wiring area 02 is relatively big, as shown in FIG. 11, there is a chance to repeatedly arrange a repeating unit 230 including one first multiplexer 232 and one second multiplexer 231 in the second direction X. However, how many second multiplexers 231 correspond to one multiplexer 232 in the actual repeating unit 230 can be determined according to the fingerprint identification signal lines 212, the data signal lines 211, an input/output ratio of the first multiplexer 232, and the input/output ratio of the second multiplexer 231.

Figure 15:
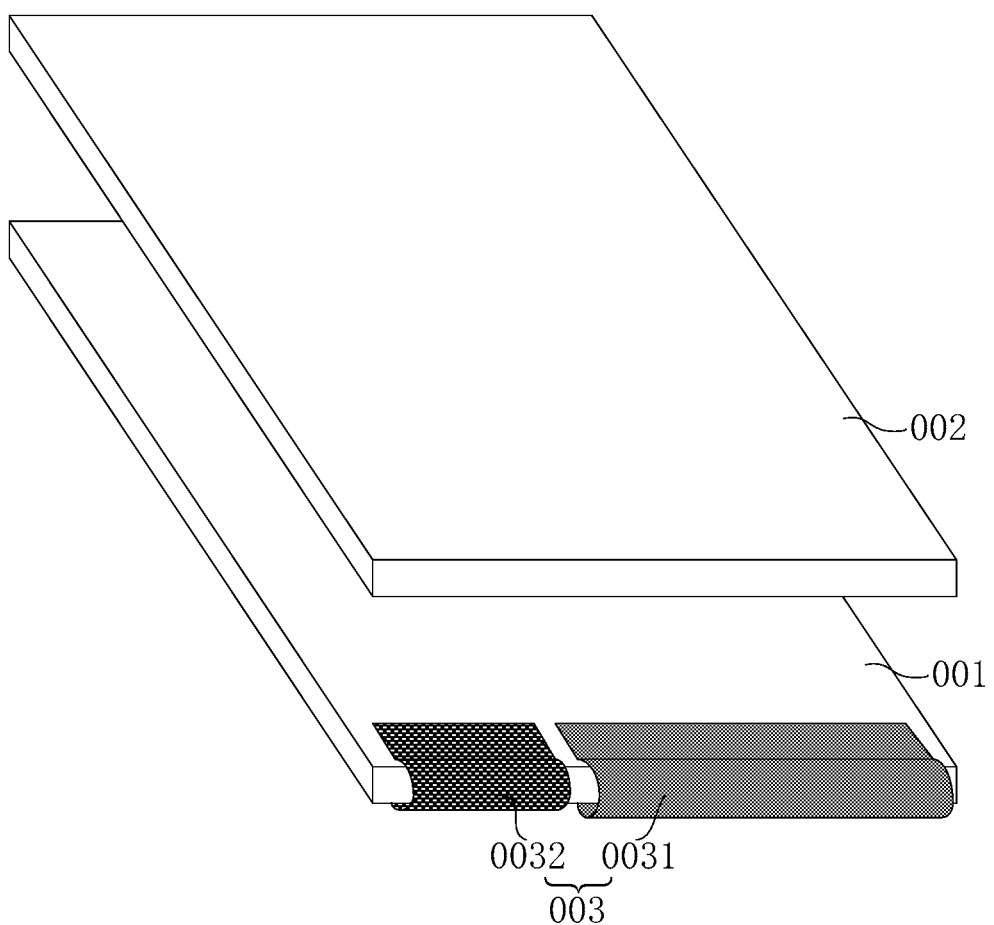
FIG. 15 is a schematic diagram of a display panel according to an embodiment of the present disclosure.

The present disclosure further provides a display panel. FIG. 15 is a schematic diagram of a display panel according to an embodiment of the present disclosure. As shown in FIG. 15, the display panel includes the array substrate 001 provided by any one of the foregoing embodiments. The display panel can further include an upper substrate 002 disposed opposite to the array substrate 001. The display panel can further include a bonding structure 003 that is bound to the array substrate 001. The bonding structure 003 may be a flexible circuit board. The bonding structure 003 may include a second-type bonding structure 0032 bound to the second-type bonding pad 312 and a first-type bonding structure 0031 bound to other bonding pads, the second-type bonding pad 312 being electrically connected to the fingerprint identification signal line 212. In the display panel provided in the embodiment of the present disclosure, at least one of the fingerprint identification signal lines of the array substrate is located in the fourth metal layer, avoiding that excessive fingerprint identification signal lines occupy other metal layers, and ensuring that the density of signal lines in each metal layer in the fan-shaped wiring area is relatively low, and thus reducing the height of the fan-shaped wiring area.

The above are only exemplary embodiments of the present disclosure, and the present disclosure is not limited thereto. Any modification, equivalent replacement, or improvement made within the principle of the present disclosure should fall into the protection scope of the present disclosure.

What is claimed is:

1. An array substrate having a display area and a fan-shaped wiring area, wherein the array substrate comprises a first metal layer, a second metal layer, and a third metal layer which are arranged in the display area and the fan-shaped wiring area, and a fourth metal layer arranged in the fan-shaped wiring area,
    wherein the first metal layer arranged in the display area comprises a plurality of gate lines, the second metal layer arranged in the display area comprises a plurality of data lines, and the third metal layer arranged in the display area comprises a plurality of touch lines,
    wherein a plurality of fingerprint identification units is arranged in the display area and a plurality of data signal lines, a plurality of touch signal lines and a plurality of fingerprint identification signal lines are arranged in the fan-shaped wiring area, and wherein the plurality of data signal lines is electrically connected to the plurality of data lines, the plurality of touch signal lines is electrically connected to the plurality of touch lines, and the plurality of fingerprint identification signal lines is electrically connected to the plurality of fingerprint identification units, and
    wherein the fourth metal layer arranged in the fan-shaped wiring area comprises at least one fingerprint identification signal line of the plurality of fingerprint identification signal lines.

2. The array substrate according to claim 1, further comprising a plurality of fingerprint identification lines in the display area, wherein the fourth metal layer is further arranged in the display area, and the fourth metal layer arranged in the display area comprises at least one fingerprint identification line of the plurality of fingerprint identification lines through which the plurality of fingerprint identification signal lines is electrically connected to the plurality of fingerprint identification units.

3. The array substrate according to claim 2, wherein both the plurality of fingerprint identification lines and the plurality of fingerprint identification signal lines are located in the fourth metal layer.

4. The array substrate according to claim 1, wherein the plurality of fingerprint identification signal lines comprises:
    a plurality of first-type fingerprint identification signal lines located in the fourth metal layer; and
    a plurality of second-type fingerprint identification signal lines located in at least one of the first metal layer, the second metal layer, and the third metal layer.

5. The array substrate according to claim 4, wherein the plurality of first-type fingerprint identification signal lines and the plurality of second-type fingerprint identification signal lines are alternately arranged.

6. The array substrate according to claim 4, wherein the plurality of second-type fingerprint identification signal lines is located in the third metal layer.

7. The array substrate according to claim 6, wherein the fourth metal layer has a same conductivity as the third metal layer.

8. The array substrate according to claim 1, wherein each of the plurality of fingerprint identification signal lines comprises a first portion and a second portion which are electrically connected to each other, the first portion being located in the fourth metal layer, and the second portion being located in at least one of the first metal layer, the second metal layer, and the third metal layer.

9. The array substrate according to claim 1, wherein
    at least one first multiplexer is arranged in the fan-shaped wiring area, wherein each of the at least one first multiplexer has an output terminal electrically connected to at least one of the plurality of fingerprint identification signal lines and an input terminal electrically connected to at least one of the plurality of fingerprint identification lines.

10. The array substrate according to claim 9, wherein the output terminal of the first multiplexer is located at a side of the first multiplexer close to the display area, and the input terminal of the first multiplexer is located at a side of the first multiplexer away from the display area.

11. The array substrate according to claim 9, wherein
    at least one second multiplexer is arranged in the fan-shaped wiring area wherein each of the at least one second multiplexer has an input terminal electrically connected to at least one of the plurality of data signal lines and an output terminal electrically connected to at least one of the plurality of data lines.

12. The array substrate according to claim 11, wherein the at least one first multiplexer and the at least one second multiplexer are arranged along a first direction, the first direction being a direction along which the display area and the fan-shaped wiring area are arranged.

13. The array substrate according to claim 11, wherein at least one of the at least one first multiplexer and at least one of the at least one second multiplexer constitute a repeating unit arranged in a second direction, the second direction intersecting a first direction, and the first direction being a direction along which the display area and the fan-shaped wiring area are arranged.

14. The array substrate according to claim 13, wherein the at least one second multiplexer comprises a plurality of second multiplexers, and one of the at least one first multiplexer and at least two of the plurality of second multiplexers constitute a repeating unit arranged along the second direction.

15. The array substrate according to claim 14, wherein the plurality of fingerprint identification units is located in a part of the display area.

16. The array substrate according to claim 13, wherein one of the at least one of first multiplexers and one of the at least one of second multiplexers constitute a repeating unit arranged in the second direction.

17. The array substrate according to claim 16, wherein the plurality of fingerprint identification units is uniformly arranged in the display area.

18. The array substrate according to claim 11,
wherein each of the at least one first multiplexer comprises a plurality of first transistors, each of the plurality of first transistors comprising a gate electrode located in the first metal layer, and a source electrode and a drain electrode which are located in the second metal layer; and
wherein each of the at least one second multiplexer comprises a plurality of second transistors, each of the plurality of second transistors comprising a gate electrode located in the first metal layer, and a source electrode and a drain electrode which are located in the second metal layer.

19. The array substrate according to claim 1, wherein the array substrate further has a bonding area,
wherein a plurality of first-type bonding pads and a plurality of second-type bonding pads are arranged in the bonding area, wherein the plurality of first-type bonding pads is electrically connected to the plurality of data signal lines, and the plurality of second-type bonding pads is electrically connected to the plurality of fingerprint identification signal lines; and
wherein the plurality of first-type bonding pads and the plurality of second-type bonding pads are arranged along a second direction, wherein the second direction intersects a first direction, and the first direction is a direction along which the display area and the fan-shaped wiring area are arranged.

20. A display panel, comprising an array substrate having a display area and a fan-shaped wiring area, wherein the array substrate comprises a first metal layer, a second metal layer, and a third metal layer which are arranged in the display area and the fan-shaped wiring area, and a fourth metal layer arranged in the fan-shaped wiring area,
wherein the first metal layer arranged in the display area comprises a plurality of gate lines, the second metal layer arranged in the display area comprises a plurality of data lines, and the third metal layer arranged in the display area comprises a plurality of touch lines,
wherein a plurality of fingerprint identification units is arranged in the display area, and a plurality of data signal lines, a plurality of touch signal lines and a plurality of fingerprint identification signal lines are arranged in the fan-shaped wiring area, wherein the plurality of data signal lines is electrically connected to the plurality of data lines, the plurality of touch signal lines is electrically connected to the plurality of touch lines, and the plurality of fingerprint identification signal lines is electrically connected to the plurality of fingerprint identification units, and
wherein the fourth metal layer arranged in the fan-shaped wiring area comprises at least one fingerprint identification signal line of the plurality of fingerprint identification signal lines.

\* \* \* \* \*